United States Patent
Hong et al.

(10) Patent No.: US 7,595,705 B2
(45) Date of Patent: Sep. 29, 2009

(54) ATTENUATOR AND STEP ATTENUATION DEVICE HAVING THE SAME

(75) Inventors: Seok Yong Hong, Seongnam-si (KR); Myung Woon Hwang, Seoul (KR)

(73) Assignee: FCI Inc., Seongnam-si (KR)

( * ) Notice: Subject to any disclaimer, the term of this patent is extended or adjusted under 35 U.S.C. 154(b) by 0 days.

(21) Appl. No.: 11/951,570

(22) Filed: Dec. 6, 2007

(65) Prior Publication Data
US 2008/0143460 A1    Jun. 19, 2008

(30) Foreign Application Priority Data
Dec. 19, 2006    (KR) .................. 10-2006-0129968

(51) Int. Cl.
*H01P 1/22* (2006.01)
(52) U.S. Cl. .................................. 333/81 R
(58) Field of Classification Search ............ 333/81 A, 333/81 R
See application file for complete search history.

(56) References Cited

U.S. PATENT DOCUMENTS

2005/0156685 A1 *    7/2005    Hauger et al. ............ 333/81 R

OTHER PUBLICATIONS

"http://en.wikipedia.org/wiki/T-pad" page modified Dec. 30, 2008.
"http://en.wikipedia.org/wiki/PI-pad" page modified Jan. 29, 2009.
"http://en.wikipedia.org/wiki/Attenuator_(electronics)" page modified Feb. 22, 2009.

* cited by examiner

*Primary Examiner*—Stephen E Jones
(74) *Attorney, Agent, or Firm*—Jae Y. Park; Kile Goekjian Reed & McMan

(57) ABSTRACT

An attenuator for attenuating an input signal at a predetermined rate and a step attenuation device having the same are provided. The attenuator includes first to sixth impedance components. A terminal of the first impedance component is connected to an input signal. A terminal of the second impedance component is connected to the other terminal of the first impedance component. The other terminal of the second impedance component outputs an attenuated signal. A terminal of the third impedance component is connected to a common terminal of the first and second impedance components. A terminal of the fourth impedance component is connected to a ground voltage. A terminal of the fifth impedance component is connected to the other terminal of the fourth impedance component. The other terminal of the fifth impedance component is connected to the ground voltage. A terminal of the sixth impedance component is connected to a common terminal of the fourth and fifth impedance component. The other terminal of the sixth impedance component is connected to the other terminal of the third impedance component.

7 Claims, 3 Drawing Sheets

ATTENUATOR AND STEP ATTENUATION DEVICE HAVING THE SAME

BACKGROUND OF THE INVENTION

1. Field of the Invention

The present invention relates to an attenuator and a step attenuation device having the same, and more particularly, to an attenuator capable of improving attenuation accuracy and reducing insertion loss with respect to an input signal and a step attenuation device having the same.

2. Description of the Related Art

An attenuator serves to generate an attenuated signal by attenuating an input signal at a predetermined rate. The attenuator is applied to various fields of radio frequency (RF) electronics. In general, the attenuator is used to decrease a power level to a desirable level. In addition, the attenuator is widely used to decrease oscillation or to reduce reflection loss.

Resistance elements of a conventional attenuator construct a T-type or Π-type structure. In case of the T-type attenuator, the insertion loss is small with respect to a signal path. However, when the T-type attenuator has a large attenuation amount, the accuracy deteriorates. On the contrary, in case of the conventional Π-type attenuator, even when the conventional Π-type attenuator has a large attenuation amount, the accuracy is high. However, the insertion loss is large with respect to the signal path.

SUMMARY OF THE INVENTION

The present invention provides an attenuator having high attenuation accuracy and low insertion loss with respect to an input signal.

The present invention also provides a step attenuation device having high attenuation accuracy and low insertion loss with respect to an input signal.

According to an aspect of the present invention, there is provided an attenuator including first to sixth impedance components.

A terminal of the first impedance component is connected to an input signal. A terminal of the second impedance component is connected to the other terminal of the first impedance component. The other terminal of the second impedance component outputs an attenuated signal. A terminal of the third impedance component is connected to a common terminal of the first and second impedance components. A terminal of the fourth impedance component is connected to a ground voltage. A terminal of the fifth impedance component is connected to the other terminal of the fourth impedance component. The other terminal of the fifth impedance component is connected to the ground voltage. A terminal of the sixth impedance component is connected to a common terminal of the fourth and fifth impedance components. The other terminal of the sixth impedance component is connected to the other terminal of the third impedance component.

According to another aspect of the present invention, there is provided a step attenuation device including a plurality of mirror T-type attenuators. The plurality of attenuators have different attenuation rates. The plurality of attenuators generate attenuated signals obtained by attenuating the same input signal at predetermined attenuation rates, respectively.

According to another aspect of the present invention, there is provided an attenuator including first to twelfth impedance components.

A terminal of the first impedance component is connected to the input signal. A terminal of the second impedance component is connected to the other terminal of the first impedance component. A terminal of the third impedance component is connected to a common terminal of the first and second impedance components. A terminal of the fourth impedance component is connected to the other terminal of the second impedance component. A terminal of the fifth impedance component is connected to the other terminal of the fourth impedance component. The other terminal of the fifth impedance component outputs the attenuated signal. A terminal of the sixth impedance component is connected to a common terminal of the fourth and fifth impedance components. A terminal of the seventh impedance component is connected to a ground voltage. A terminal of the eighth impedance component is connected to the other terminal of the seventh impedance component. A terminal of the ninth impedance component is connected to a common terminal of the seventh and eighth impedance components. The other terminal of the ninth impedance component is connected to the other terminal of the third impedance component. A terminal of the tenth impedance component is connected to the other terminal of the eighth impedance component. A terminal of the eleventh impedance component is connected to the other terminal of the tenth impedance component. The other terminal of the eleventh impedance component is connected to the ground voltage. A terminal of the twelfth impedance component is connected to a common terminal of the tenth and eleventh impedance components. The other terminal of the twelfth impedance component is connected to the other terminal of the sixth impedance component.

According to another aspect of the present invention, there is provided a step attenuation device including a plurality of mirror Π-type attenuators. The plurality of attenuators have different attenuation rates. The plurality of attenuators generate attenuated signals obtained by attenuating the same input signal at predetermined attenuation rates, respectively.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, exemplary embodiments of the present invention will be described in detail with reference to the attached drawings.

Figure 1:
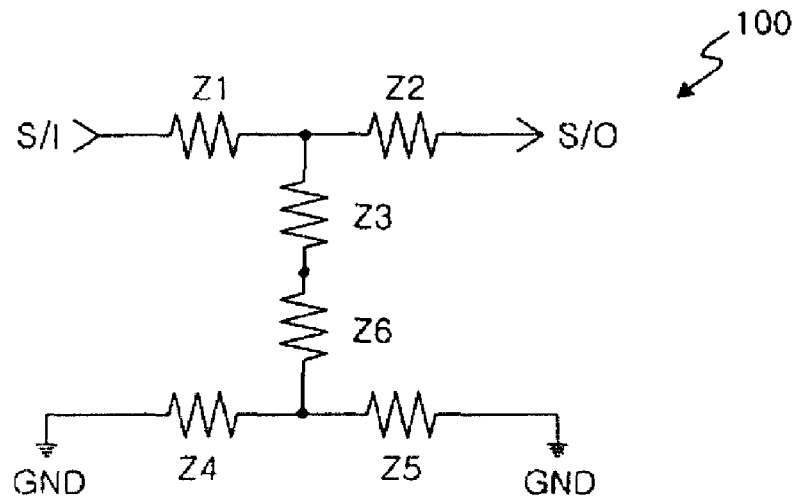
FIG. 1 illustrates an attenuator according to an embodiment of the present invention.

FIG. 1 illustrates an attenuator according to an embodiment of the present invention.

Referring to FIG. 1, an attenuator 100 according to the embodiment includes impedance components Z1 to Z6.

Since two basic T-type attenuators are connected to each other in a mirror configuration in the attenuator 100 shown in FIG. 1, the attenuator 100 is referred to as a mirror T-type attenuator.

A basic T-type attenuator is constructed with serially connected first and second impedance components Z1 and Z2 and a third impedance component Z3 connected to the common terminal of the first and second impedance components Z1 and Z2.

The other basic T-type attenuator is constructed with serially connected fourth and fifth impedance components Z4 and Z5 and a sixth impedance component Z6 connected to the common terminal of the fourth and fifth impedance components Z4 and Z5.

Each of the impedance components Z1 to Z6 may be constructed with only resistance elements. Alternatively, impedance components may be constructed with active elements instead of the resistance elements. The active elements may be MOS transistors or bipolar transistors. It will be understood by those of ordinary skill in the art that impedance components are embodied in various manners.

The first to sixth impedance components Z1 to Z6 of the mirror T-type attenuator 100 according to the embodiment are connected to one another as follows.

A terminal of the first impedance component Z1 is connected to an input signal S/I. A terminal of the second impedance component Z2 is connected to the other terminal of the first impedance component Z1. The other terminal of the second impedance component Z2 is connected to an output signal S/O to output an attenuated signal. A terminal of the third impedance component Z3 is connected to a common terminal of the first and second impedance components Z1 and Z2. A terminal of the fourth impedance component Z4 is connected to a ground voltage GND. A terminal of the fifth impedance component Z5 is connected to the other terminal of the fourth impedance component Z4. The other terminal of the fifth impedance component Z5 is connected to the ground voltage GND. A terminal of the sixth impedance component Z6 is connected to a common terminal of the fourth and fifth impedance components Z4 and Z5. The other terminal of the sixth impedance component Z6 is connected to the other terminal of the third impedance component Z3.

Figure 2:
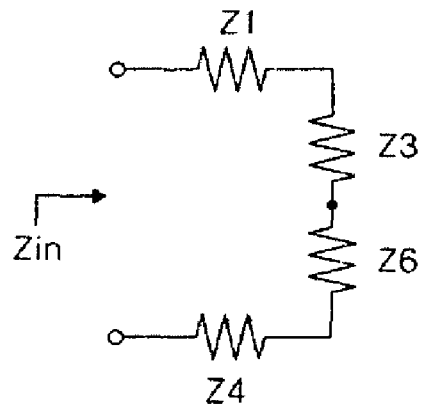
FIG. 2 illustrates input impedance of the attenuator shown in FIG. 1.
Figure 3:
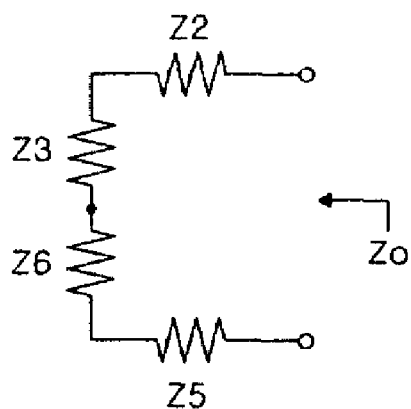
FIG. 3 illustrates output impedance of the attenuator shown in FIG. 1.

FIG. 2 illustrates input impedance of the mirror T-type attenuator shown in FIG. 1. FIG. 3 illustrates output impedance of the mirror T-type attenuator shown in FIG. 1

Referring to FIGS. 2 and 3, the input impedance Zin and the output impedance Zo of the mirror T-type attenuator 100 are represented as follows.

$$Zin=Z1+Z3+Z6+Z4 \quad \text{[Equation 1]}$$

$$Zo=Z2+Z3+Z6+Z5 \quad \text{[Equation 2]}$$

Accordingly, a gain defined as a ratio of output impedance to input impedance is represented as follows.

$$\text{Gain} = \frac{Zo}{Zin} = \frac{(Z2+Z5)+(Z3+Z6)}{(Z1+Z4)+(Z3+Z6)} \quad \text{[Equation 3]}$$

An attenuation rate is defined as follows.

$$dB=20\log_{10}\text{Gain} \quad \text{[Equation 4]}$$

Accordingly, it is possible to obtain a desirable attenuation rate (dB) by suitably controlling impedance of the impedance components Z1 to Z6 in the mirror T-type attenuator 100.

Figure 4:
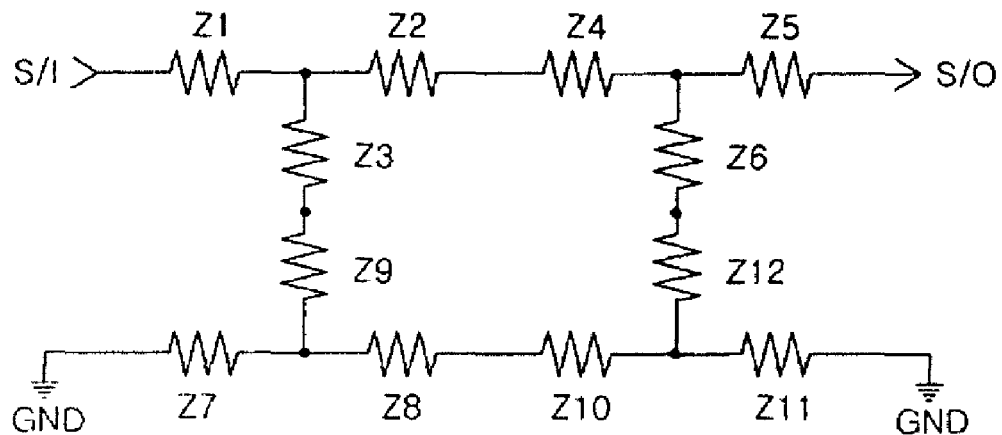
FIG. 4 illustrates an attenuator according to another embodiment of the present invention.

FIG. 4 illustrates an attenuator according to another embodiment of the present invention.

Referring to FIG. 4, an attenuator 400 according to the embodiment includes twelve impedance components Z1 to Z12.

Since two basic Π-type attenuators are connected to each other in a mirror configuration in the attenuator 400 shown in FIG. 4, the attenuator 400 is referred to as a mirror Π-type attenuator.

A basic Π-type attenuator is constructed with serially connected first, second, fourth, and fifth impedance components Z1, Z2, Z4, and Z5, a third impedance component Z3 connected to a common terminal of the first and second impedance components Z1 and Z2, and a sixth impedance component Z6 connected to a common terminal of the fourth and fifth impedance components Z4 and Z5.

The other basic Π-type attenuator is constructed with serially connected seventh, eighth, tenth, and eleventh impedance components Z7, Z8, Z10, and Z11, a ninth impedance component Z9 connected to a common terminal of the seventh and eighth impedance components Z7 and Z8, and a twelfth impedance component Z12 connected to a common terminal of the tenth and eleventh impedance components Z10 and Z11.

The first to twelfth impedance components Z1 to Z12 of the mirror Π-type attenuator 400 according to the embodiment are connected to one another as follows.

A terminal of the first impedance component Z1 is connected to an input signal S/I. A terminal of the second impedance component Z2 is connected to the other terminal of the first impedance component Z1. A terminal of the third impedance component Z3 is connected to a common terminal of the first and second impedance components Z1 and Z2. A terminal of the fourth impedance component Z4 is connected to the other terminal of the second impedance component Z2. A terminal of the fifth impedance component Z5 is connected to the other terminal of the fourth impedance component Z4. The other terminal of the fifth impedance component Z5 is connected to an output signal S/O to output an attenuated signal. A terminal of the sixth impedance component Z6 is connected to a common terminal of the fourth and fifth impedance components Z4 and Z5.

A terminal of the seventh impedance component Z7 is connected to a ground voltage GND. A terminal of the eighth impedance component Z8 is connected to the other terminal of the seventh impedance component Z7. A terminal of the ninth impedance component Z9 is connected to a common terminal of the seventh and eighth impedance components Z7 and Z8. The other terminal of the ninth impedance component Z9 is connected to the other terminal of the third impedance component Z3. A terminal of the tenth impedance component Z10 is connected to the other terminal of the eighth impedance component Z8. A terminal of the eleventh impedance component Z11 is connected to the other terminal of the tenth impedance component Z10. The other terminal of the eleventh impedance component Z11 is connected to the ground voltage GND. A terminal of the twelfth impedance component Z12 is connected to a common terminal of the tenth and eleventh impedance components Z10 and Z11. The other terminal of the twelfth impedance component Z12 is connected to the other terminal of the sixth impedance component Z6.

Figure 5:
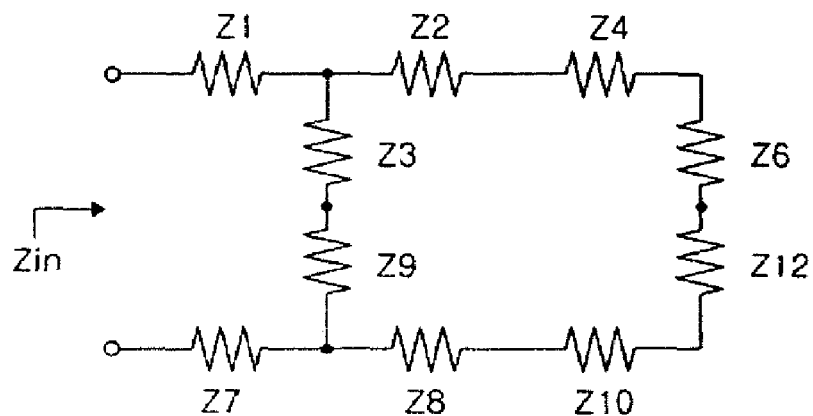
FIG. 5 illustrates input impedance of the attenuator shown in FIG. 4.

FIG. 5 illustrates input impedance of the mirror Π-type attenuator shown in FIG. 4.

Figure 6:
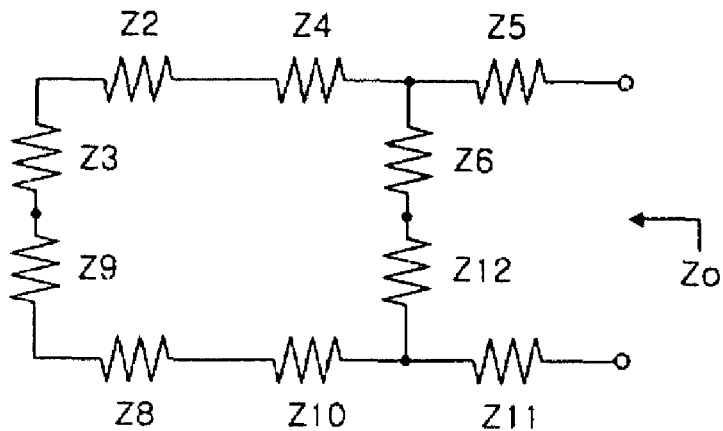
FIG. 6 illustrates output impedance of the attenuator shown in FIG. 4.

FIG. 6 illustrates output impedance of the mirror Π-type attenuator shown in FIG. 4.

Referring to FIGS. 5 and 6, the input impedance Zin and the output impedance Zo of the mirror Π-type attenuator 400 are represented as follows.

$$Zin = Z1 + \frac{(Z3+Z9)(Z2+Z4+Z6+Z12+Z10+Z8)}{(Z3+Z9)+(Z2+Z4+Z6+Z12+Z10+Z8)} + Z7 \quad \text{[Equation 5]}$$

$$Zo = Z5 + \frac{(Z6+Z12)(Z4+Z2+Z3+Z9+Z8+Z10)}{(Z6+Z12)+(Z4+Z2+Z3+Z9+Z8+Z10)} + Z11 \quad \text{[Equation 6]}$$

Here, for the convenience, when $Z2+Z4+Z8+Z10$ is Za, $Z3+Z9$ is Zb, and $Z6+Z12$ is Zc, Equations 5 and 6 may be briefly represented by Equations 7 and 8 as follows.

$$Zin = (Z1+Z7) + \frac{Zc(Za+Zb)}{Za+Zb+Zc} \quad \text{[Equation 7]}$$

$$Zo = (Z5+Z11) + \frac{Zc(Za+Zb)}{Za+Zb+Zc} \quad \text{[Equation 8]}$$

Accordingly, a gain is represented as follows.

$$\text{Gain} = \frac{Zo}{Zin} = \frac{(Z5+Z11) + \frac{Zc(Za+Zb)}{Za+Zb+Zc}}{(Z1+Z7) + \frac{Zb(Za+Zc)}{Za+Zb+Zc}} \quad \text{[Equation 9]}$$

Accordingly, it is possible to obtain a desirable attenuation rate (dB) by suitably controlling impedance of the impedance components Z1 to Z12 in the mirror Π-type attenuator 400.

Figure 7:
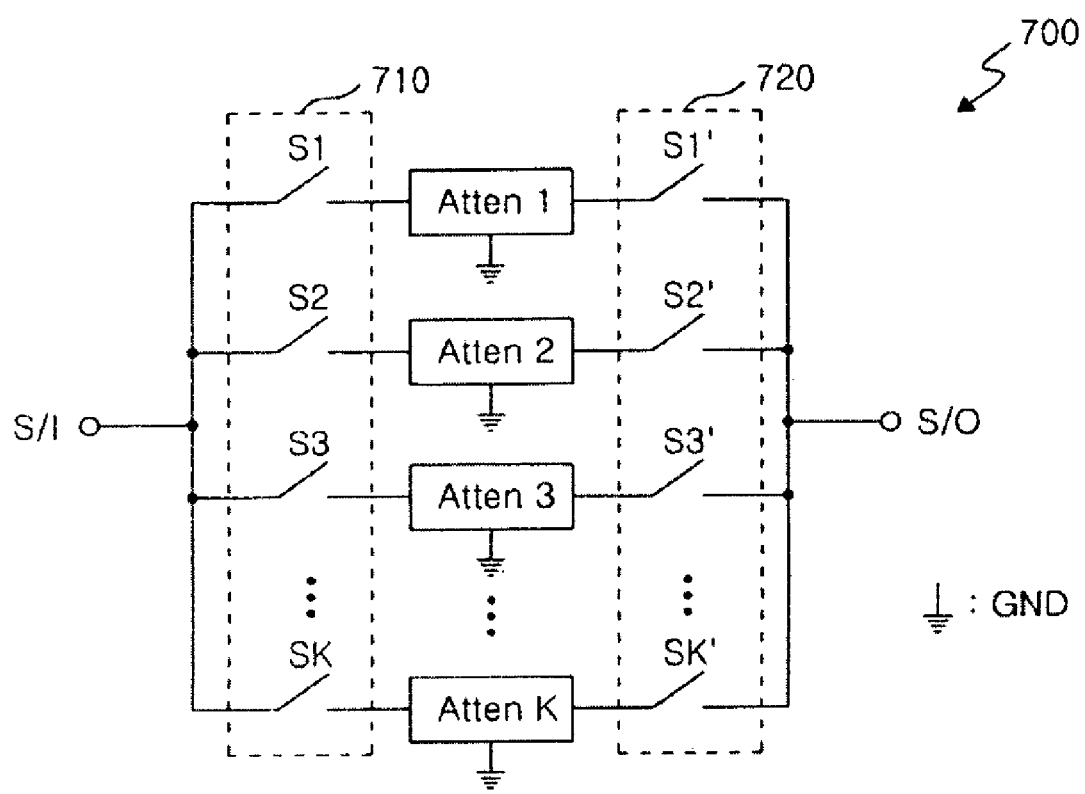
FIG. 7 illustrates a step attenuation device according to an embodiment of the present invention.

FIG. 7 illustrates a step attenuation device 700 according to an embodiment of the present invention.

Referring to FIG. 7, the step attenuation device 700 includes a plurality of attenuators Atten 1 to Atten k.

The plurality of attenuators Atten 1 to Atten k may include at least one mirror T-type attenuator 100 or include at least one mirror Π-type attenuator 400.

In some cases, the plurality of attenuators Atten 1 to Atten k may include at least one mirror T-type attenuator 100 and at least one mirror Π-type attenuator 400 in combination with each other.

The plurality of attenuators Atten 1 to Atten k have different attenuation rates. For example, a first attenuator Atten 1 can generate a signal attenuated at an attenuation rate of 0 decibel (dB), and a second attenuator Atten 2 can generate a signal attenuated at an attenuation rate of 6 dB.

In addition, the plurality of attenuators Atten 1 to Atten k generates attenuated signals (S/O) obtained by attenuating the same input signal S/I at predetermined attenuation rates.

When receiving an input signal (S/I), a signal path connected to only one attenuator selected form among the plurality of attenuators Atten 1 to Atten k is activated. At this time, the attenuated signal S/O is output by attenuating the input signal S/I at an attenuation rate allocated to the attenuator. All the signal paths connected to the other attenuators are closed.

The step attenuation device 700 may further include a first switch unit 710 multiplexing and transmitting the input signal S/I to the plurality of attenuators Atten 1 to Atten k and a second switch unit 720 demultiplexing a plurality of attenuated signals S/O output from the plurality of attenuators Atten 1 to Atten k into a signal.

Here, the first switch unit 710 may be embodied as a multiplexer. The second switch unit 720 may be embodied as a demultiplexer.

As described above, in the attenuator and the step attenuation device having the same according to an embodiment of the present invention, it is possible to improve attenuation accuracy and to reduce insertion loss with respect to an input signal.

While the present invention has been particularly shown and described with reference to exemplary embodiments thereof, it will be understood by those skilled in the art that various changes in form and details may be made therein without departing from the spirit and scope of the present invention as defined by the appended claims.

What is claimed is:

1. An attenuator for generating an attenuated signal by attenuating an input signal at a predetermined rate, the attenuator comprising a plurality of attenuators comprising:
   a first impedance component having a terminal connected to the input signal;
   a second impedance component having a terminal connected to the other terminal of the first impedance component and the other terminal outputting the attenuated signal;
   a third impedance component having a terminal connected to a common terminal of the first and second impedance components;
   a fourth impedance component having a terminal connected to a ground voltage;
   a fifth impedance component having a terminal connected to the other terminal of the fourth impedance component and the other terminal connected to the ground voltage; and
   a sixth impedance component having a terminal connected to a common terminal of the fourth and fifth impedance components and the other terminal connected to the other terminal of the third impedance component,
   wherein the plurality of attenuators have different attenuation rates, and
   wherein the plurality of attenuators generate attenuated signals obtained by attenuating the same input signal at predetermined attenuation rates, respectively.

2. The step attenuation device of claim 1, comprising:
   a first switch unit multiplexing and transmitting the input signal to the plurality of attenuators; and
   a second switch unit demultiplexing a plurality of attenuated signals output from the plurality of attenuators into a signal.

3. The step attenuation device of claim 2,
   wherein the first switch unit is a multiplexer, and
   wherein the second switch unit is a demultiplexer.

4. An attenuator for generating an attenuated signal by attenuating an input signal at a predetermined rate, the attenuator comprising:
   a first impedance component having a terminal connected to the input signal;
   a second impedance component having a terminal connected to the other terminal of the first impedance component;
   a third impedance component having a terminal connected to a common terminal of the first and second impedance components;

a fourth impedance component having a terminal connected to the other terminal of the second impedance component;

a fifth impedance component having a terminal connected to the other terminal of the fourth impedance component and the other terminal outputting the attenuated signal;

a sixth impedance component having a terminal connected to a common terminal of the fourth and fifth impedance components;

a seventh impedance component having a terminal connected to a ground voltage;

an eighth impedance component having a terminal connected to the other terminal of the seventh impedance component;

a ninth impedance component having a terminal connected to a common terminal of the seventh and eighth impedance components and the other terminal connected to the other terminal of the third impedance component;

a tenth impedance component having a terminal connected to the other terminal of the eighth impedance component;

an eleventh impedance component having a terminal connected to the other terminal of the tenth impedance component and the other terminal connected to the ground voltage; and a twelfth impedance component having a terminal connected to a common terminal of the tenth and eleventh impedance components and the other terminal connected to the other terminal of the sixth impedance component.

5. A step attenuation device comprising a plurality of the attenuators of claim 4, wherein the plurality of attenuators have different attenuation rates, and wherein the plurality of attenuators generates attenuated signals obtained by attenuating the same input signal at predetermined attenuation rates, respectively.

6. The step attenuation device of claim 5, further comprising:

a first switch unit multiplexing and transmitting the input signal to the plurality of attenuators; and a second switch unit demultiplexing a plurality of attenuated signals output from the plurality of attenuators into a signal.

7. The step attenuation device of claim 6, wherein the first switch unit is a multiplexer, and wherein the second switch unit is a demultiplexer.

* * * * *